United States Patent
Gao et al.

(10) Patent No.: US 10,020,655 B2
(45) Date of Patent: Jul. 10, 2018

(54) GLOBAL SYNCHRONOUS PULSE WIDTH MODULATION SYSTEM AND METHOD FOR DISTRIBUTED GRID-CONNECTED INVERTER SYSTEM

(71) Applicant: SHANDONG UNIVERSITY, Shandong (CN)

(72) Inventors: Feng Gao, Shandong (CN); Tao Xu, Shandong (CN)

(73) Assignee: SHANDONG UNIVERSITY, Jinan (CN)

( * ) Notice: Subject to any disclaimer, the term of this patent is extended or adjusted under 35 U.S.C. 154(b) by 270 days.

(21) Appl. No.: 14/784,848

(22) PCT Filed: Feb. 5, 2015

(86) PCT No.: PCT/CN2015/072266
§ 371 (c)(1),
(2) Date: Oct. 15, 2015

(87) PCT Pub. No.: WO2015/127849
PCT Pub. Date: Sep. 3, 2015

(65) Prior Publication Data
US 2016/0064935 A1  Mar. 3, 2016

(30) Foreign Application Priority Data
Feb. 28, 2014  (CN) .......................... 2014 1 0073512

(51) Int. Cl.
*H02J 3/38* (2006.01)
*H02J 3/40* (2006.01)
*H03K 7/08* (2006.01)

(52) U.S. Cl.
CPC ................ *H02J 3/381* (2013.01); *H02J 3/40* (2013.01); *H03K 7/08* (2013.01)

(58) Field of Classification Search
CPC ....................................................... H02J 3/381
(Continued)

(56) References Cited

U.S. PATENT DOCUMENTS

| 4,581,693 | A | * | 4/1986 | Ueda | H02M 7/527 |
|---|---|---|---|---|---|
| | | | | | 318/811 |
| 2013/0049656 | A1 | * | 2/2013 | Yasui | H02P 21/00 |
| | | | | | 318/400.02 |
| 2014/0319916 | A1 | * | 10/2014 | Cummings | H02J 1/102 |
| | | | | | 307/53 |

FOREIGN PATENT DOCUMENTS

| CN | 101719679 A | 6/2010 |
|---|---|---|
| CN | 101860023 A | 10/2010 |

(Continued)

OTHER PUBLICATIONS

Apr. 29, 2015 Search Report issued in International Patent Application No. PCT/CN2015/072266.
(Continued)

*Primary Examiner* — Joseph Chang
(74) *Attorney, Agent, or Firm* — Oliff PLC

(57) ABSTRACT

The global synchronous pulse width modulation system includes main control unit and plurality of grid-connected inverters located at different geographical locations, wherein each grid-connected inverter is connected with a distributed power supply; each grid-connected inverter is connected with a grid through a point of common coupling; main control unit communicates with all grid-connected inverters through communication channels; main control unit receives information of grid-connected inverters and respectively sends a global synchronous signal containing global synchronous strategy to grid-connected inverters after determining global synchronous strategy; grid-connected inverters regulate the phases of their own pulse width modulation waves through global synchronous signal to enable pulse (Continued)

width modulation waves of grid-connected inverters to satisfy a phase difference of harmonic counteraction, so as to counteract harmonic current injected by grid-connected inverters into grid. Advantages include eliminating the disordered superimposition problem of harmonic current of the inverters and mutually counteracting harmonic current between distributed inverters.

11 Claims, 7 Drawing Sheets

(58) Field of Classification Search
USPC .......................................................... 307/82
See application file for complete search history.

(56) References Cited

FOREIGN PATENT DOCUMENTS

| | | |
|---|---|---|
| CN | 103023060 A | 4/2013 |
| CN | 103840485 A | 6/2014 |
| JP | H11-41815 A | 2/1999 |
| JP | 2001-078363 A | 3/2001 |

OTHER PUBLICATIONS

Apr. 29, 2015 Written Opinion issued in International Patent Application No. PCT/CN2015/072266.

* cited by examiner $t(m)' - t(1)' = \triangle t(m)$
$m = 2, 3 \cdots N$

US 10,020,655 B2

GLOBAL SYNCHRONOUS PULSE WIDTH MODULATION SYSTEM AND METHOD FOR DISTRIBUTED GRID-CONNECTED INVERTER SYSTEM

FIELD OF THE INVENTION

The present invention relates to a global synchronous pulse width modulation system and method for a distributed grid-connected inverter system.

BACKGROUND OF THE INVENTION

A distributed grid-connected inverter system is used for connecting a distributed power supply to a grid through grid-connected inverters. In order to reduce the influence of harmonics output by the grid-connected inverters on the grid, many methods are proposed in the existing patents, but the research objects of these methods are single inverters, which can only reduce the harmonics of one inverter. Under normal circumstances, the grid-connected inverters are distributed at different positions, as shown in FIG. 1, each grid-connected inverter is independently controlled by a controller thereof to send or absorb power from the grid. The quality of output waveforms of the inverters can be controlled by a pulse width modulation method. Although each inverter controls the total harmonic distortion rate of the output current thereof within an allowable range to meet the requirements of the national standard, when a lot of inverters are connected to a point of common coupling or a local grid, since the pulse width modulation waves of the inverters cannot satisfy the phase relationship of mutually counteracting the harmonic current between the inverters, the total current harmonic of the grid is in a disordered superimposition state, the superimposition result of the harmonics of the grid is unknown, and may be more serious, or there may be partial counteraction of each other.

As shown in FIG. 2, for convenience of expression, the inverter is split into two parts, namely a controller and a power circuit in FIG. 2, and the distributed power supply is omitted. The total harmonic distortion of the output current of each inverter is smaller than a certain determined value, namely THDm<Xm % (m=1, 2 ... N), the inverters are independently controlled by the controllers, the pulse width modulation waves of the inverters cannot satisfy the phase relationship of mutually counteracting the harmonic current between the inverters, namely t(m)−t(1)=? in FIG. 2 is an indeterminate value, the disorderly superposed current harmonics can make the total harmonic distortion rate of the current of the grid exceed the requirements of the grid, that is, THD<? in FIG. 2 expresses that the total harmonic distortion is indeterminate, or when the line impedance is relatively large, voltage distortion of the point of common coupling can be caused to bring a serious power quality problem. In the existing patents, only the current harmonics output by one inverter can be reduced, while the problem of the current harmonics injected by the point of common coupling into the grid cannot be controlled, some articles mention the synchronization of different inverters, but are aimed at the synchronization on power frequency of parallel operation inverters at the same location, but mention no harmonic elimination problem. The patent proposes a global synchronous pulse width modulation method, in which global pulse width modulation is performed on inverters distributed at different locations to effectively reduce the current harmonics injected by the point of common coupling into the grid.

SUMMARY OF THE INVENTION

The object of the present invention is to solve the above problems and provide a global synchronous pulse width modulation system and method for a distributed grid-connected inverter system. It has the advantages of eliminating the disordered superimposition problem of harmonic current of inverters and mutually counteracting the harmonic current between the distributed inverters.

To achieve the above object, the present invention adopts the following technical solutions:

A global synchronous pulse width modulation system for a distributed grid-connected inverter system includes a main control unit and a plurality of grid-connected inverters located at different geographical locations, wherein each grid-connected inverter is connected with a distributed power supply; each grid-connected inverter is connected with a grid through a point of common coupling; the main control unit communicates with all grid-connected inverters; the main control unit receives the information of the grid-connected inverters and respectively sends a global synchronous signal containing a global synchronous strategy to the grid-connected inverters after determining the global synchronous strategy; and the grid-connected inverters regulate the phases of their own pulse width modulation waves through the global synchronous signal to enable the pulse width modulation waves of the grid-connected inverters to satisfy a phase difference of harmonic counteraction, so as to counteract harmonic current injected by the grid-connected inverters into the grid.

A working method of the global synchronous pulse width modulation system for the distributed grid-connected inverter system includes the following steps:

step (1a): the main control unit receiving the information of the grid-connected inverters and determining the global synchronous strategy of the distributed grid-connected inverter systems; namely determining the time difference $\Delta t(m_a)$ between the pulse width modulation wave moments $t(m_a)'$ of the inverters $m_a$ in all of N inverters participating in global pulse width modulation and the pulse width modulation wave moment $t(1)'$ of an arbitrarily appointed reference inverter 1, where the value range of m is 2 to N, and a expresses that the inverters are not grouped; $\Delta t(m_a)=t(m_a)'-t(1)'$; since the pulse of the pulse width modulation wave has a certain width, the moment at the midpoint of the pulse is collectively set as the pulse width modulation wave moment; and the inverter 1 is arbitrarily appointed, and since the pulse width modulation waves of the inverters are continuously repeated, the pulse width modulation wave of one inverter is appointed as reference;

step (2a): the main control unit determining the time interval of each synchronization according to the global synchronous strategy in the step (1a) and the clock accuracy of the grid-connected inverters, and judging whether a sending time is arrived at, if the sending time is arrived at, the main control unit sending the corresponding global synchronous signal to the grid-connected inverters to enter a step (3a); and if the sending time is not arrived at, returning to the step (1a);

step (3a):

after receiving the global synchronous signal of the main control unit, the grid-connected inverters only changing the output moments of their own pulse width modulation waves of the grid-connected inverters, with the pulse widths in the pulse width modulation waves unchanged, such that the pulse width modulation waves of the inverters and the pulse width modulation wave of the inverter 1 satisfy the time difference $\Delta_t(m_a)$; and finally the phase difference between the pulse width modulation waves of the inverters satisfies the phase difference required by a synchronous unit to enable mutual counteraction of the harmonic current of the inverters between the inverters, so as to counteract the harmonic current injected by the grid-connected inverters into the grid.

A working method of the global synchronous pulse width modulation system for the distributed grid-connected inverter system includes the following steps:

step (1b): the main control unit receiving the information of the grid-connected inverters and determining the global synchronous strategy of the distributed grid-connected inverter systems; dividing all inverters participating in global pulse width modulation into N groups according to the principle that enables the harmonic current output by the inverters to be mutually counteracted between the inverters to the maximum, and determining the time difference $\Delta t(m_b)$ between the pulse width modulation wave moments $t(m_b)'$ of all inverters in the inverter groups in, and the pulse width modulation wave moment $t(1)'$ of an arbitrarily appointed reference inverter 1, where b expresses that the inverters are grouped; $\Delta t(m_b)=t(m_b)'-t(1)'$; since the pulse of the pulse width modulation wave has a certain width, the moment at the midpoint of the pulse is collectively set as the pulse width modulation wave moment; and the inverter 1 is an arbitrarily appointed one, and since the pulse width modulation waves of the inverters are continuously repeated, the pulse width modulation wave of one inverter is appointed as reference;

step (2b): the main control unit determining the time interval of each synchronization according to the global synchronous strategy in the step (1b) and the clock accuracy of the grid-connected inverters, and judging whether a sending time is arrived at, if the sending time is arrived at, the main control unit sending the corresponding global synchronous signal to the grid-connected inverters to enter a step (3b); and if the sending time is not arrived at, returning to the step (1b);

step (3b):

after receiving the global synchronous signal of the main control unit, the grid-connected inverters only changing the output moments of their own pulse width modulation waves of the grid-connected inverters, with the pulse widths in the pulse width modulation waves unchanged, such that the pulse width modulation waves of the inverters and the pulse width modulation wave of the inverter 1 satisfy the time difference $\Delta t(m_b)$; and finally the phase difference between the pulse width modulation waves of the inverters satisfies the phase difference required by a synchronous unit to enable mutual counteraction of the harmonic current of the inverters between the inverters, so as to counteract the harmonic current injected by the grid-connected inverters into the grid.

The information of the grid-connected inverters in the step (1 a) and the step 1(b) includes parameters of the distributed grid-connected inverter system, parameters of the grid and requirements on the quality of the current injected by the point of common coupling into the grid.

The global synchronous control strategy in the step (1 a) is as follows: the number of all inverters participating in the global pulse width modulation is N, and taking the pulse width modulation wave of one inverter as reference, the pulse width modulation waves of other inverters are lagged in sequence:

$$\Delta t(m_a)=(m_a-1)T_c/N;\ m=2,3\ldots;$$

where $\Delta t(m_a)$ is the time difference between the pulse width modulation wave moment $t(m_a)'$ of the inverter $m_a$ and the pulse width modulation wave moment $t(1)'$ of the inverter 1;

$T_c$ is switching frequency; N is the number of the inverters participating in the global pulse width modulation; $m_a$ represents the $m_a$th inverter; a expresses that the inverters are not grouped.

Angle expression is as follows:

$$\Delta \varphi(m_a)=(m_a-1)\times 2\pi/N;\ m=2,3\ldots;$$

a expresses that the inverters are not grouped;

$\Delta \varphi(m_a)$ represents the degree of angle corresponding to $\Delta t(m_a)$ when a switching period is regarded as 360 degrees;

N is the number of the inverters participating in the global pulse width modulation. The global synchronous control strategy in the step (1b) is as follows: all inverters participating in the global pulse width modulation are divided into N groups according to the principle that enables the harmonic current output by the inverters to be mutually counteracted between the inverters to the maximum, and taking the pulse width modulation wave of one inverter as reference, the pulse width modulation waves of other inverters are lagged in sequence:

$$\Delta t(m_b)=(m_b-1)T_c/N;\ m=2,3\ldots;$$

where $\Delta t(m_b)$ is the time difference between the pulse width modulation wave moments $t(m_b)'$ of all inverters in the inverter group $m_b$ and the pulse width modulation wave moment $t(1)'$ of the inverter 1;

$T_c$ is switching frequency; N is the number of the inverter groups participating in the global pulse width modulation; $m_b$ represents the $m_b$ th group of inverters; b expresses that the inverters are grouped;

angle expression is as follows:

$$\Delta \varphi(m_b)=(m_b-1)\times 2\pi/N;\ m=2,3\ldots$$

where $\Delta \varphi(m_b)$ represents the degree of angle corresponding to $\Delta t(m_b)$ when a switching period is regarded as 360 degrees;

N is the number of the inverter groups participating in the global pulse width modulation.

In the step (3a) and the step (3b), after the inverters receive the global synchronous signal, if the sending channel of the global synchronous signal is a fast communication channel, the signal transmission time is much shorter than the switching period of a switching element in the inverter, it is considered that the communication has no time delay in theoretical analysis, the synchronous unit determines the time intervals of the pulse width modulation waves of the inverters, after respectively arriving at the sending times determined in the step (2a) and the step (2b), pulse signals are sent to N inverters by N ports through N fast communication channels, the time intervals of the N pulse signals represent the time intervals of the pulse width modulation waves of the inverters, after receiving the pulse signals, the inverters change the output moments of their own pulse width modulation waves of the grid-connected inverters, with the pulse widths in the pulse width modulation waves unchanged, such that the pulse width modulation waves of the inverters and the pulse width modulation wave of the inverter 1 satisfy the time difference $\Delta t(m)$, i=a or b; a expresses that the inverters are not grouped; b expresses that the inverters are grouped.

In the step (3a) and the step (3b), after the inverters receive the global synchronous signal, if the sending channel of the global synchronous signal is not a fast communication channel, the signal transmission time is not much shorter than the switching period of a switching element in the inverter, the signal transmission time is not negligible, and the phase of the synchronous signal is adjusted by an accurate GPS clock.

The present invention has the following beneficial effects:
1. the global synchronous pulse width modulation method is adopted in the distributed grid-connected inverter system in the present invention to reduce the current harmonics injected by the distributed grid-connected inverter system into the point of common coupling and improve the power quality.
2. The present invention proposes a new solution to the problem that the distributed grid-connected inverter system affects the power quality, being different from the solutions directed to single inverters in the existing patents, the control objects in the present invention are a plurality of inverters at different geographical locations, and by means of global synchronous control, the pulse width modulation waves of the plurality of inverters at different geographical locations satisfy the phase relationship of counteracting the harmonics under the control of the synchronous signal, so as to reduce the influence on the grid.
3. According to the present invention, the disordered superimposition problem of the harmonic current of the inverters can be eliminated, and the harmonic current can be counteracted between the distributed inverters.
4. In the step (1a) and the step (1b), the synchronous strategy is formulated on the basis of obtaining the information of all inverters, to mutually counteract the harmonic current between the inverters so as to reduce the volume of a necessary filter.
5. In the step (2a) and the step (2b), the set time intervals are synchronized to ensure that the pulse width modulation waves of the inverters always maintain the set time intervals determined by the synchronous strategy, and the time intervals are properly increased to reduce the requirements on the performance of the synchronous unit while guaranteeing the synchronous precision.
6. In the step (3a) and the step (3b), the inverters at different geographical locations can correctly implement the global synchronous strategy to finally achieve the global synchronous pulse width modulation.

DETAILED DESCRIPTION OF THE EMBODIMENTS

A further illustration of the present invention will be given below in combination with the accompanying drawings and embodiments.

Figure 3:
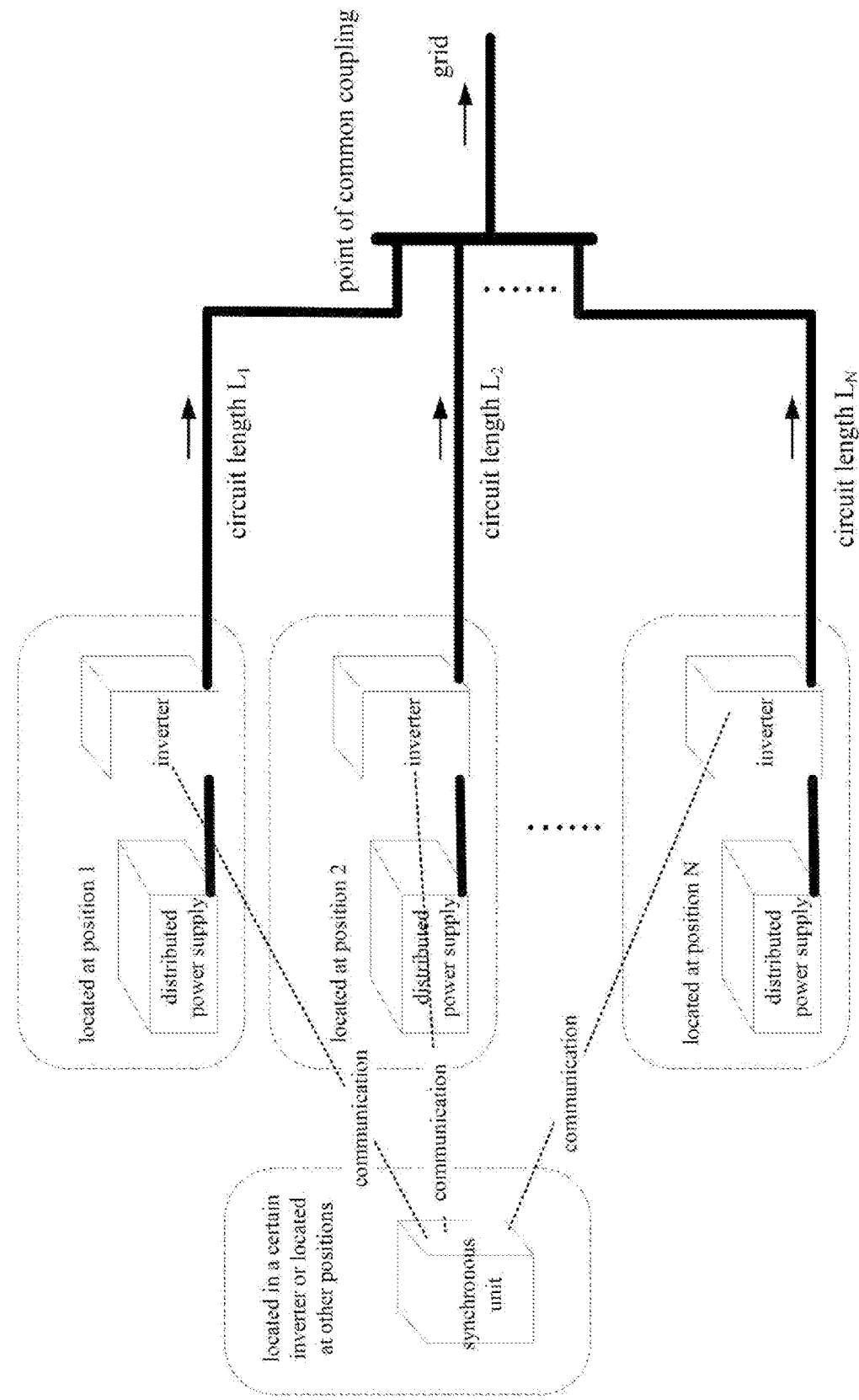
FIG. 3 is a distributed inverter system performing global synchronous pulse width modulation.
Figure 4:
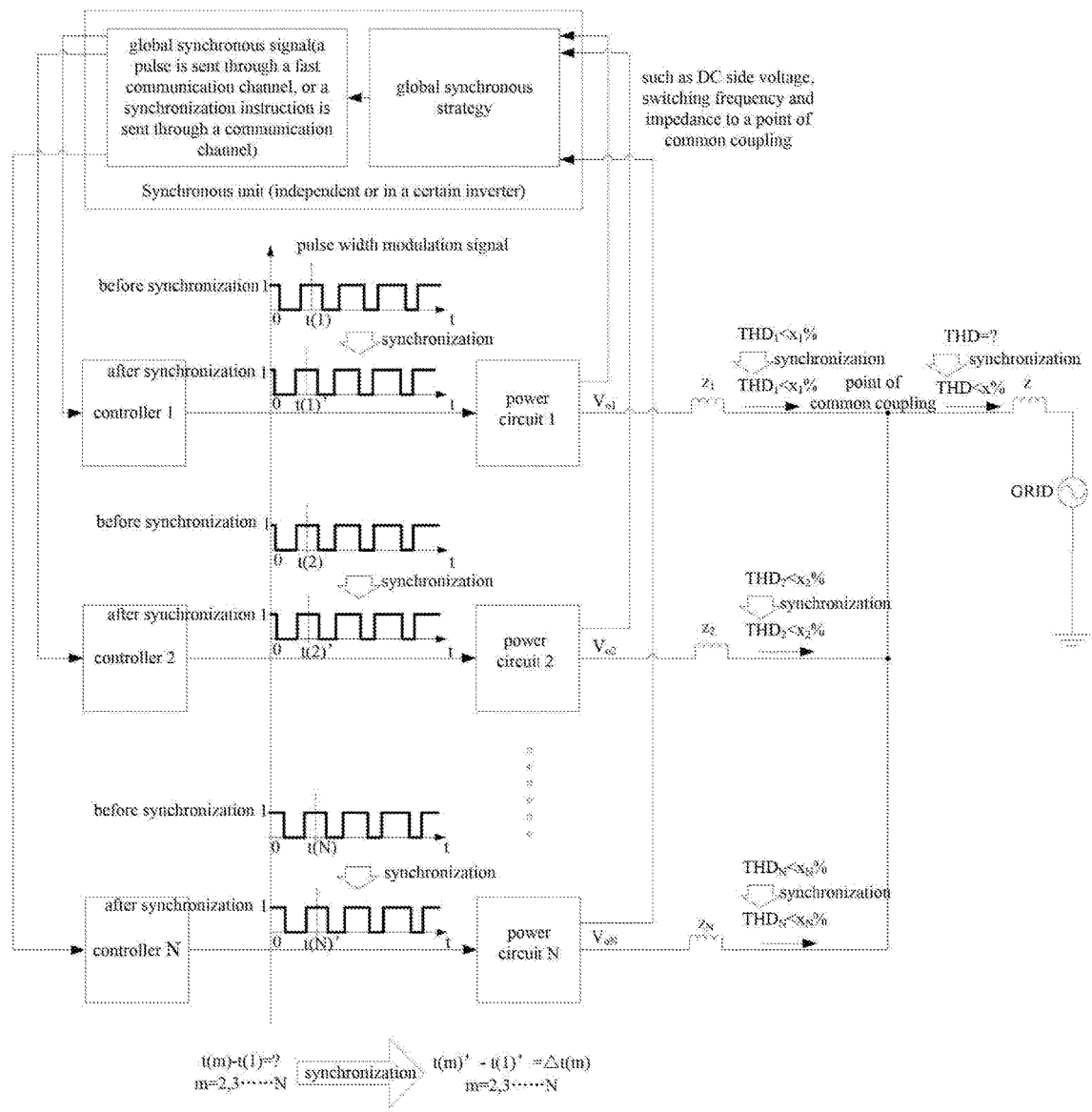
FIG. 4 is an equivalent diagram of FIG. 3, wherein a distributed power supply is omitted, an inverter is split into two parts, namely a controller and a power circuit, and information transmission is marked.

As shown in FIGS. 3 and 4, a global synchronous pulse width modulation system for a distributed grid-connected inverter system includes a main control unit and a plurality of grid-connected inverters located at different geographical locations, wherein each grid-connected inverter is connected with a distributed power supply; each grid-connected inverter is connected with a grid through a point of common coupling; the main control unit communicates with all grid-connected inverters through communication channels; the main control unit receives the information of the grid-connected inverters and respectively sends a global synchronous signal containing a global synchronous strategy to the grid-connected inverters after determining the global synchronous strategy; and the grid-connected inverters regulate the phases of their own pulse width modulation waves through the global synchronous signal to enable the pulse width modulation waves of the grid-connected inverters to satisfy a phase difference of harmonic counteraction, so as to counteract harmonic current injected by the grid-connected inverters into the grid. The communication channels can be optical fibers and wireless networks.

Figure 5:
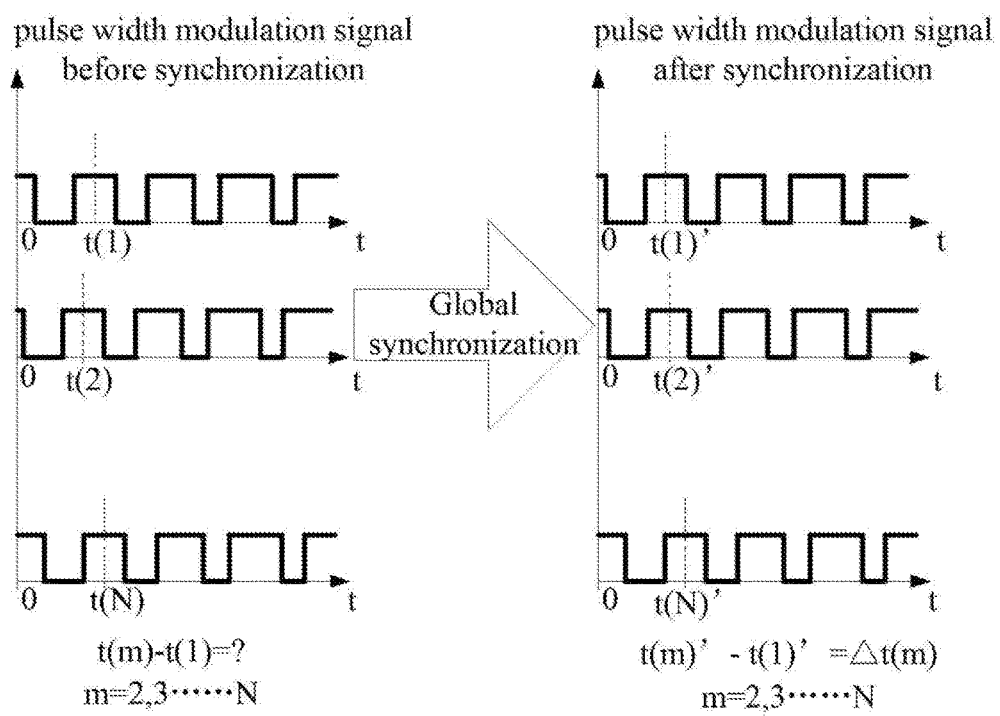
FIG. 5 is a phase relationship of pulse width modulation waves of inverters before and after performing global synchronous pulse width modulation.
Figure 6:
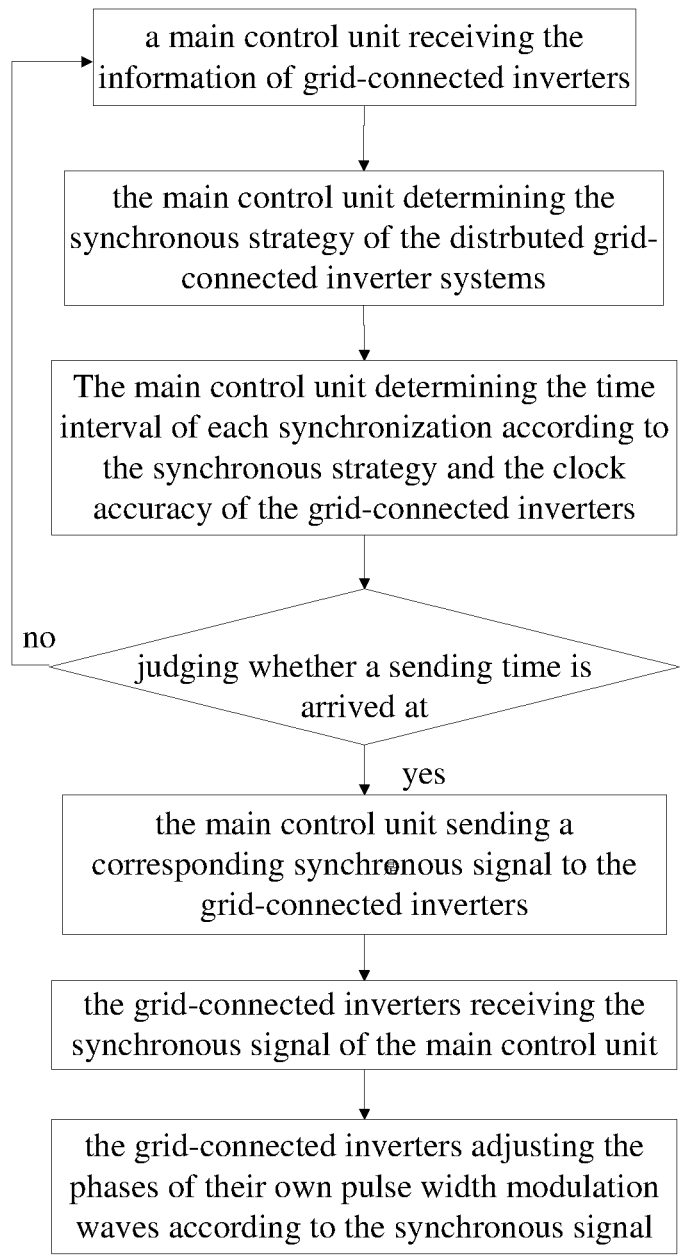
FIG. 6 is a flow diagram of a global synchronous pulse width modulation method.

As shown in FIG. 6, a working method of the global synchronous pulse width modulation system for the distributed grid-connected inverter system includes the following steps: step (1): the main control unit receiving the information of the grid-connected inverters and determining the global synchronous strategy of the distributed grid-connected inverter systems; namely determining the time difference $\Delta t(m)$ between the pulse width modulation wave moments $t(m)'$ of the inverters m and the pulse width modulation wave moment $t(1)'$ of an arbitrarily appointed reference inverter 1, $\Delta t(m)=t(m)'-t(1)'$; and the inverter 1 may be an arbitrarily appointed one, and since the pulse width modulation waves of the inverters are continuously repeated, the pulse width modulation wave of one inverter is appointed as reference, as shown in FIG. 5;

step (2): the main control unit determining the time interval of each synchronization according to the global synchronous strategy in the step (1) and the clock accuracy of the grid-connected inverters, and judging whether a sending time is arrived at, if the sending time is arrived at, the main control unit sending the corresponding global synchronous signal to the grid-connected inverters to enter a step (3); and if the sending time is not arrived at, returning to the step (1);

step (3):

after receiving the global synchronous signal of the main control unit, the grid-connected inverters only changing the output moments of their own pulse width modulation waves of the grid-connected inverters, with the pulse widths in the pulse width modulation waves unchanged, such that the pulse width modulation waves of the inverters and the pulse width modulation wave of the inverter 1 satisfy the time difference $\Delta t(m)$; and finally the phase difference between the pulse width modulation waves of the inverters satisfies the phase difference required by a synchronous unit to enable mutual counteraction of the harmonic current of the inverters between the inverters, so as to counteract the harmonic current injected by the grid-connected inverters into the grid.

The information of the grid-connected inverters in the step (1) includes parameters of the distributed grid-connected inverter system, parameters of the grid and requirements on the quality of the current injected by the point of common coupling into the grid.

The synchronous control strategy in the step (1) is as follows: with SPWM as an example for analysis, the synchronous strategy is also applicable to any other pulse width modulation methods, and taking the triangular carrier of one inverter as reference, the triangular carriers of other inverters are lagged in sequence:

$$\Delta t(m)=(m-1)T_c/N (m=2,3 \ldots N)$$

where $\Delta t(m)$ is the time difference between the pulse width modulation wave moment $t(m)'$ of the inverter m and the pulse width modulation wave moment $t(1)'$ of the inverter 1, $T_c$ is switching frequency, N is the number of the inverters participating in the global synchronous strategy, and m represents the mth inverter; angle expression is as follows:

$$\Delta\varphi(m)=(m-1)\times 2\pi/N;\ m=2,3 \ldots$$

where $\Delta\varphi(m)$ represents the degree of angle corresponding to $\Delta t(m)$ when a switching period is regarded as 360 degrees; N is the number of the inverters participating in the global synchronous strategy; after each period of time, the main control unit sends synchronous pulses, the time difference between the synchronous pulses and the first pulse is $\Delta t(m)$, and after the inverters receive the synchronous pulse signals, triangular waves immediately start counting from 0.

Since the time delay of the communication channels is negligible, the MCU processing procedures of the inverters are the same, thus the triangular waves of the inverters can be sequentially lagged for $\Delta\varphi(m)$, and accordingly, the pulse width modulation waves of the inverters are lagged for $\Delta\varphi(m)$ compared with that of the inverter 1.

Since the line resistance is negligible, and the bridge arms of the inverters are generally connected with filter inductors after output, so that the resistance part in Z is negligible.

The principle of determining the synchronous time interval in the step (2) is that: the pulse width modulation waves of the inverters always maintain the time interval determined by the synchronous strategy, an error exists, but the error cannot exceed a set range.

When determining the synchronous time interval in the step (2), the following considerations are needed:
(2.1) if the clock accuracy of the inverters is high, no too large time error may occur within a long period of time, thus a longer time interval may be selected for the next synchronization, and if the clock accuracy of the inverters is low, a shorter time interval is selected for the next synchronization.
(2.2) If the change period of the synchronous strategy is very short, a shorter time interval is selected for the next synchronization; if the change period of the synchronous strategy is very long, a longer time interval may be selected for the next synchronization.
(2.3) If an allowable error range is very small or each switching period of the inverter is very short, a shorter time interval is selected for the next synchronization; if the allowable error range is large or each switching period of the inverter is long, a longer time interval may be selected for the next synchronization.

In the step (3), after receiving the synchronous signal, the inverters adjust the phase of the synchronous signal according to the requirements of the signal. The adjustment method will be explained below with two methods as an example:
1. The sending channel of the global synchronous signal is a fast communication channel (for example, an optical fiber), the signal transmission time is much shorter than the switching period of a switching element in the inverter, it is considered that the communication has no time delay in theoretical analysis, the synchronous unit determines the time intervals of the pulse width modulation waves of the inverters, after arriving at the sending time determined in the step (2), pulse signals are sent to N inverters by N ports through N fast communication channels, the time intervals of the N pulse signals represent the time intervals of the pulse width modulation waves of the inverters, and after receiving the pulse signals, the inverters immediately clear comparison counters in PWM modules to zero.
2. The sending channel of the synchronous signal is not a fast communication channel (for example, wireless), the signal transmission time is not much shorter than the switching period of a switching element in the inverter, the signal transmission time is not negligible, if the solution in method 1 is still adopted, the synchronous precision is hard to guarantee. In this case, it can be achieved by an accurate GPS clock. For example, the synchronous unit wants to synchronize the inverters at 12:00:00 someday, it must send the information to the inverters in advance and may send the information one minute earlier at 11:59:00. The information sent to the inverter 1 is: "zero clearing the comparison counter at 12:00:00", and the information sent to the inverter m is: "zero clearing the comparison counter at 12:00:00+$\Delta$t (m)". Since all the inverters have the accurate GPS clocks, respective adjustments can be performed according to the above information.

Since the hardware structures of the inverters are different, specific response strategies are different, for example, in C2000 series of DSP chips of the TI company, registers and hardware structures specially for adjusting phases are arranged in the PWM modules, thus the adjustment is relatively simple.

The main control unit sends a synchronous control instruction to the inverters through the communication channels, as shown in FIG. 3, so that the phases between the pulse width modulation waves of the inverters satisfy the relationship capable of counteracting the harmonics, as shown in FIGS. 4 and 5, so as to counteract the current harmonics at the point of common coupling as much as possible to improve the power quality of the grid; and that a plurality of inverters can be used according to a variety of synchronous manners commanded by the main control unit (the fast communication channel, the accurate clock and the like). The communication channel can be a variety of currently used way of communication (optical fiber, wireless and the like), and it is determined by the working demand of the distributed inverters as to specifically which synchronous mode and communication way are specifically used is.

The working principle of the present invention is as follows:

a synchronous relationship is established between a plurality of inverters to enable the pulse width modulation waves thereof to meet the phase relationship capable of counteracting the harmonics. In the prior art, it is merely mentioned that the synchronous relationship is established between different modules in the same inverter, but how to establish synchronization between a plurality of inverters is not illustrated in any technology.

Figure 1:
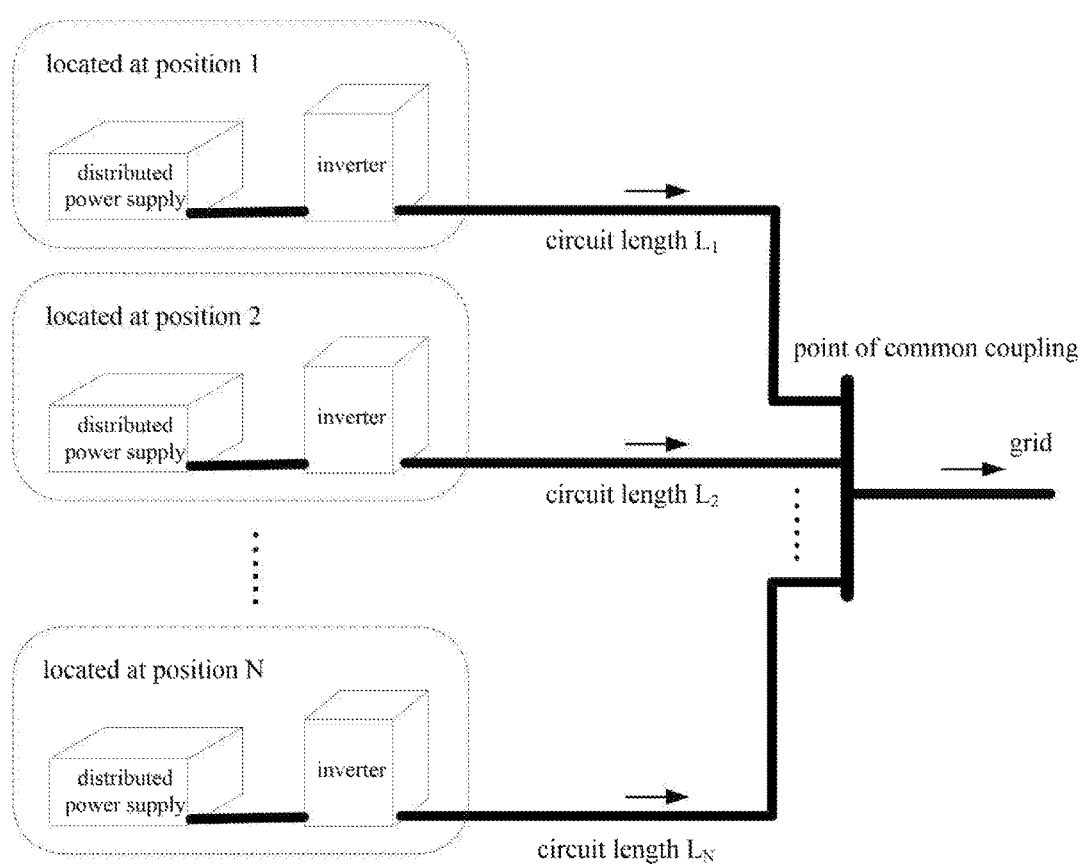
FIG. 1 is a distributed inverter system performing no global synchronous pulse width modulation.
Figure 2:
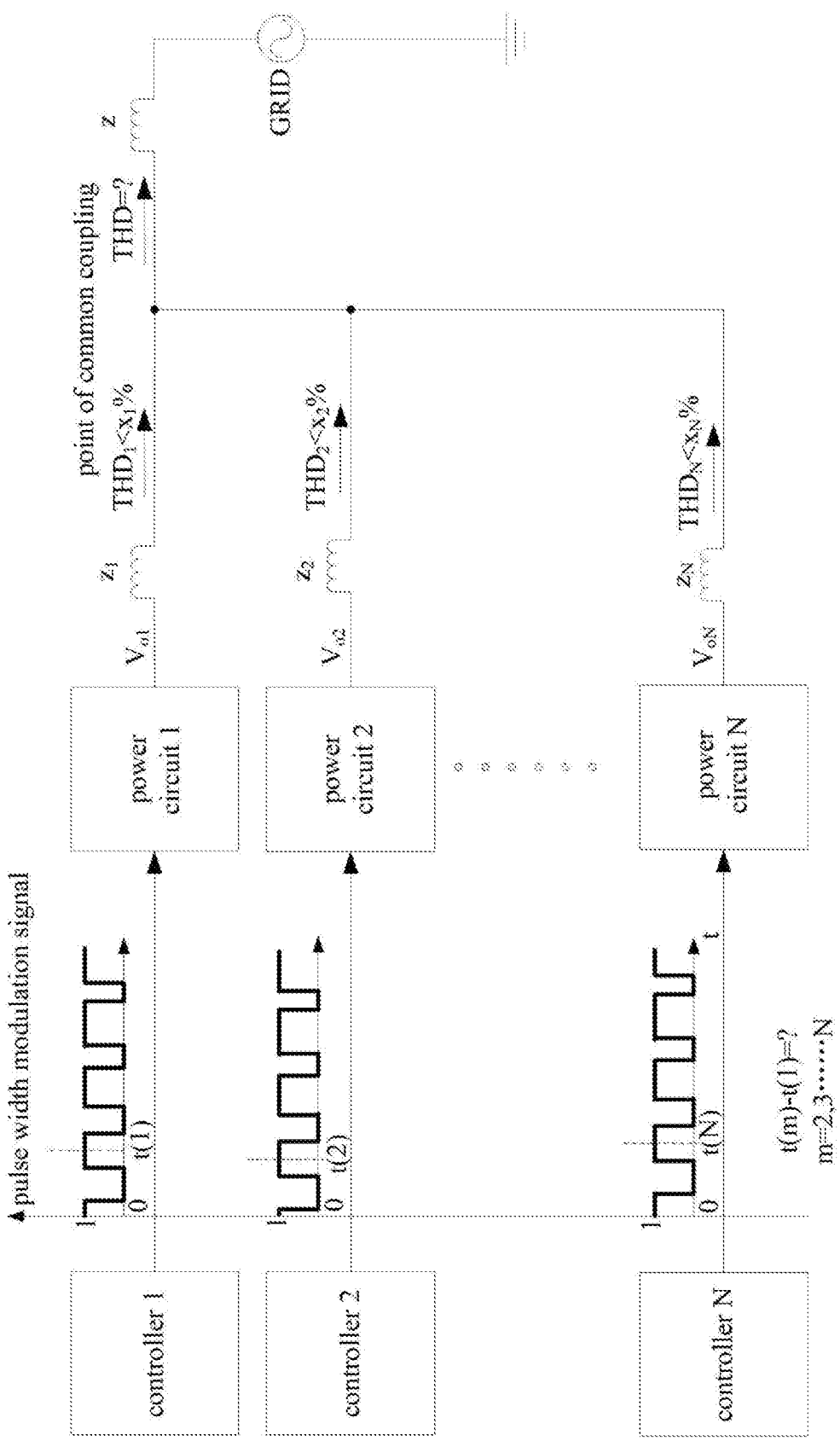
FIG. 2 is an equivalent diagram of FIG. 1, wherein a distributed power supply is omitted and an inverter is split into two parts, namely a controller and a power circuit.

According to the present invention, the harmonic current flowing into the grid can be reduced, x1, x and the like in FIG. 1 express certain ripple wave indexes, and the front and back of arrows marked as synchronization respectively express the main change parts of the entire system before and after the synchronization.

Figure 7:
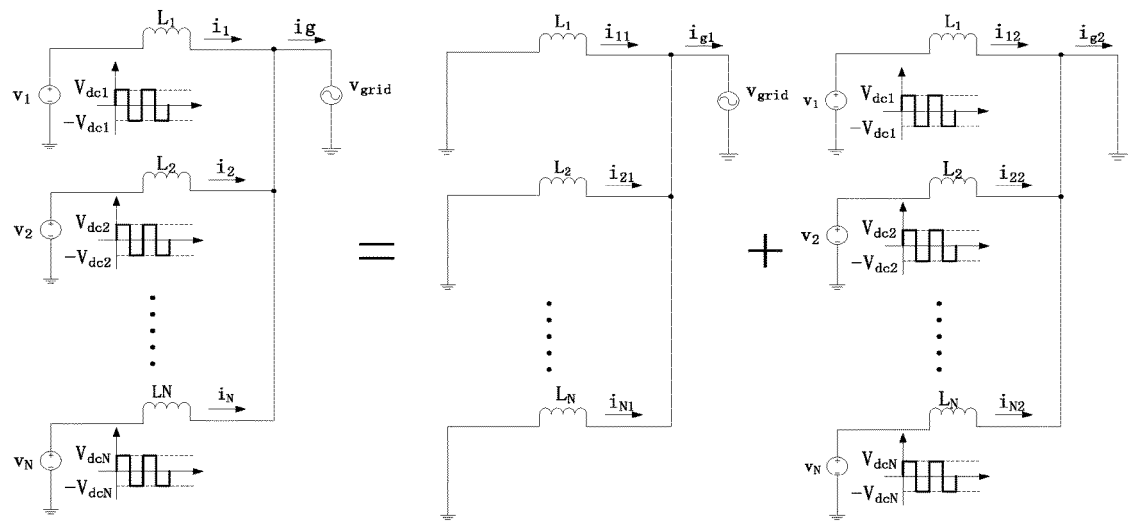
FIG. 7 is a schematic diagram of a voltage source model when an inverter is equivalent to outputting square waves.

For the inverter, no matter which pulse width modulation method is adopted, the voltage waveform at the output end of the inverter is a square wave, and the inverter is equivalent to a voltage source outputting square waves, as shown in FIG. 7. With the bipolar SPWM of a single-phase inverter as an example, the inverter is equivalent to a voltage source model outputting square waves, and a circuit model is: in an equivalent circuit, circuit elements are all linear, and the circuit can be regarded as having superposition of merely $V_{grid}$ action and merely $V_1$-$V_N$ action.

In the case of single $V_{grid}$ action, under normal circumstances, the voltage of the grid is a sine wave, $i_{g1}$, and $i_{11}$ to $i_{N1}$ are sine waves, and no harmonic current exists.

In the case of $V_1$-$V_N$ action, $i_1$ to $i_N$ fundamental waves are sine waves, but containing harmonics, and $i_{g2}$ is superposition of $i_{12}$ to $i_{N2}$.

Therefore, when analyzing the harmonic current, it is possible to only analyze the $V_1$-$V_N$ action, and the inverters are free of mutual interference, so that the output current of each inverter can be singly analyzed and then the output current is superposed.

It is set that N inverters are arranged in total, when the switching frequency of all inverters in the system is fs, the voltages on the DC sides are $V_{dc}$, and the impedance output by the bridge arms of the inverters to the grid is Z, since the line resistance is negligible and the bridge arms of the inverters are generally connected with the filter inductors after output, the Z resistance part is negligible, and the impedance between the mth inverter and the grid is expressed by $L_m$.

The inductive current is:

$$I_L = I_{t0} + \frac{V_L}{L_m}(t - t_0)$$

where $I_{to}$ is the current when the inductance is at $t_0$.

For a unidirectional circuit, the inductance voltage is the voltage between two bridge arms and is in direct proportion to the voltage at the DC side. Therefore, the slope of the inductive current is in direct proportion to $V_{dcm}/L_m$ and thus the slopes of the inductive current of the N circuits are equal.

The synchronous control strategy is that taking the triangular carrier of one inverter as reference, the triangular carriers of other inverters are lagged in sequence:

$$\Delta t_m = (m-1)T_c/N (m=2,3 \ldots N)$$

where $\Delta_t(m)$ is the time difference between the pulse width modulation wave moment t(m)' of the inverter m and the pulse width modulation wave moment t(1)' of the inverter 1;

$T_c$ is switching frequency;

N is the number of the inverters participating in the global synchronous strategy;

m represents the mth inverter;

angle expression is as follows:

where $\Delta\varphi(m) = (m-1) \times 2\pi/N; m=2,3 \ldots$ $\Delta\varphi(m)$ represents the degree of angle corresponding to $\Delta t(m)$ when a switching period is regarded as 360 degrees;

N is the number of the inverters participating in the global synchronous strategy; after determining the synchronous strategy, a synchronous MCU sends the synchronous signal containing the synchronous strategy to the inverters. The inverters adjust the phases of their own pulse width modulation waves according to the synchronous signal, since the pulses in the pulse modulation waves have certain lengths, the midpoint of each pulse is used as the point for determining the phase relationship, in this case, the phase difference between the pulse width modulation waves of the inverters has changed from having no relationship to that the phase difference can counteract the angles of the harmonics, and since the phase difference between the pulse width modulation waves can counteract the angles of the harmonics, mutual counteraction of the current of the circuits can be achieved (two examples have been listed for the sending manner of the synchronous signal and how the inverters adjust their own pulse width modulation waves according to the synchronous signal, and a lot of existing chips have such structures with respect to different modulation methods, SPWM, SVPWM and the like), as shown in FIG. 5.

Figure 8:
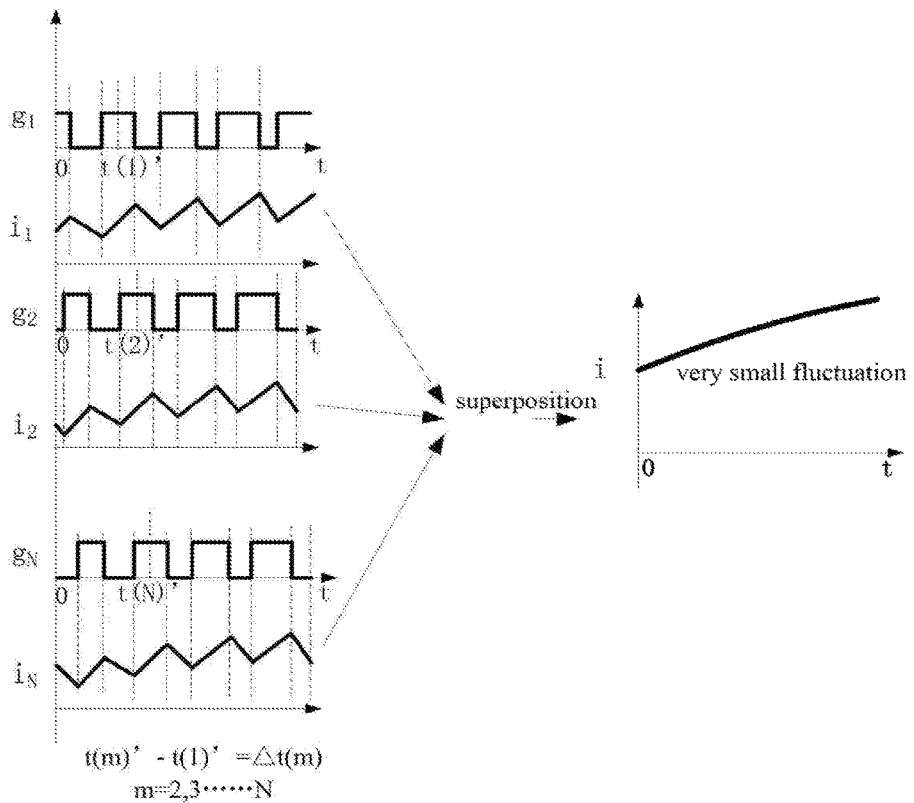
FIG. 8 is a schematic diagram of a switch driving waveform, output current waveforms of inverters and an overall waveform of current injected into a grid when phase shifts exist between pulse width modulation waves.

As shown in FIG. 8, for various pulse width modulation methods, when the pulse width modulation wave is 1, the inductive current increases, and when the pulse width modulation wave is 0, the inductive current decreases. The pulse width modulation waves of a plurality of inverters are staggered by the time capable of counteracting the harmonics, in order to stagger the ascending and descending moments of the inductive current of the inverters, in this way, the sum of the inductive current, namely the fluctuation of the current flowing into the grid is very small.

After each period of time, the synchronous MCU sends synchronous pulses, the time difference between the synchronous pulses and the first pulse is $\Delta t(m)$, and after the inverters receive the synchronous pulse signals, triangular waves immediately start counting from 0. Since the time delay of the communication channels is negligible, the MCU processing procedures of the inverters are the same, and thus the triangular waves of the inverters can be sequentially lagged for $\Delta\varphi(m)$.

Since the line resistance is negligible, and the bridge arms of the inverters are generally connected with the filter inductors after output, the Z resistance part is negligible. FIG. 8 shows the switch driving waveform and the output current waveform when the triangular waves have phase shifts;

thus it can be seen that the phase shifts of the triangular waves are equivalent to translating the charging and discharging time of line inductance, and the harmonic current can flow between the inverters without influencing the current input to the grid.

Embodiment 1

Corresponding to the condition that the inverters are not grouped, 4 inverters are connected to the point of common coupling in the system, the switching frequency of the inverters is all 20 k, the voltages at the DC sides are all Vdc, and the inductance from the point of common coupling is all L, the inverters are not grouped, N=4, m=1, 2, 3, 4.

Step 11, the synchronous unit obtains the switching frequency, the voltages at the DC sides and the reactance to the point of common coupling of the inverters.

The time of one switching period is:

$$T_c = \frac{1}{20 \times 10^3} = 50 \text{ μs}$$

$$\Delta t(1) = (1-1)T_c/4 = 0 \text{ μs}$$

-continued $\Delta t(2) = (2-1)T_c/4 = 12.5 \ \mu s$ $\Delta t(3) = (3-1)T_c/4 = 25 \ \mu s$ $\Delta t(4) = (4-1)T_c/4 = 37.5 \ \mu s$ Step 12, setting the synchronous time interval as 1 minute and entering a step 13 after waiting for 1 minute;

step 13, adopting a fast communication mode the synchronous unit: sending a pulse to an optical fiber 1 from a port 1, a rising edge is effective, 12.5 us later sending a pulse to an optical fiber 2 from a port 2, the rising edge is effective, (25-12.5) us later sending a pulse to an optical fiber 3 from a port 3, the rising edge is effective, (37-12.5) us later sending a pulse to an optical fiber 3 from a port 3, and the rising edge is effective.

Inverters 1-4: immediately zero clearing triangular wave comparison counters in PWM modules after receiving the rising edges of the pulses.

Embodiment 2

Corresponding to the condition that the inverters are not grouped, 5 inverters are connected to the point of common coupling in the system, the switching frequency of the inverters is all 20 k, the voltages at the DC sides are all Vdc, and the inductance from the point of common coupling is all L, the inverters are not grouped, N=5, m=1, 2, 3, 4, 5.

Step 21, the synchronous unit obtains the switching frequency, the voltages at the DC sides and the reactance to the point of common coupling of the inverters.

The inverters are divided into two groups for control, the time of one switching period of one group is:

$T_c = \dfrac{1}{20 \times 10^3} = 50 \ \mu s$ $\Delta t(1) = (1-1)T_c/5 = 0 \ \mu s$ $\Delta t(2) = (2-1)T_c/5 = 10 \ \mu s$ $\Delta t(3) = (3-1)T_c/5 = 20 \ \mu s$ $\Delta t(4) = (4-1)T_c/5 = 30 \ \mu s$ $\Delta t(5) = (4-1)T_c/5 = 40 \ \mu s$ Step 22, the switching frequency is higher, setting the synchronous time interval as 30 seconds and entering a step 23 after waiting for 30 seconds;

step 23, adopting a GPS clock synchronous method:
the synchronous unit: the time of the previous synchronization is 11:30:30, the time of the present synchronization is 11:31:00, sending synchronous information to the 5 inverters at 11:30:55, the information sent to the inverter 1 is: "zero clearing the comparison counter at 11:31:00"; the information sent to the inverter 2 is: "zero clearing the comparison counter at 11:31:00+10 us"; the other inverters are similar.

Inverters 1-5: zero clearing triangular wave comparison counters in PWM modules according to zero clearing time set by a main control MCU after receiving the information.

Embodiment 3

Step 31: corresponding to the condition that the inverters are grouped, 11 inverters are connected to the point of common coupling in the system, the switching frequency of the inverters is all 40 k, but when the voltages at the DC sides and the reactance to the point of common coupling are different, the inverters are marked, the voltage parameters at the DC sides and the reactance parameters of the inverters are as shown in table 1, examples are listed herein for analysis, but do not represent actual parameter values, the inverters are divided into 4 groups according to a method that the $V_{dcm}/L_m$ sums in the groups are close, the groups are as shown in the table 1, the inverters 1, 2, 3 form the first group, the inverters 4, 5, 6 form the second group, the inverters 7, 8, 9 form the third group, the inverters 10, 11 form the fourth group, N=4, m=1, 2, 3, 4.

TABLE 1

| | 1 | 2 | 3 | 4 | 5 | 6 | 7 | 8 | 9 | 10 | 11 |
|---|---|---|---|---|---|---|---|---|---|---|---|
| Vdc | 1.6 | 1.2 | 0.7 | 1.3 | 1.5 | 0.9 | 1.1 | 1.3 | 0.8 | 1.6 | 1.7 |
| L/e-6H | 1.5 | 1.1 | 1 | 1.2 | 1.3 | 1.2 | 1.2 | 1.2 | 0.9 | 1 | 1.2 |
| $V_{dcm}/L_m$ sum | | 2.86e6 | | | 2.99e6 | | | 2.89e6 | | | 3e6 |

$T_c = \dfrac{1}{40 \times 10^3} = 25 \ \mu s$ $\Delta t(1) = (1-1)T_c/4 = 0 \ \mu s$ $\Delta t(2) = (2-1)T_c/4 = 6.25 \ \mu s$ $\Delta t(3) = (3-1)T_c/4 = 12.5 \ \mu s$ $\Delta t(4) = (4-1)T_c/4 = 18.75 \ \mu s$ Step 32, the switching frequency is higher, setting the synchronous time interval as 30 seconds and entering a step 33 after waiting for 30 seconds;

step 33, adopting a fast communication mode the synchronous unit: sending a pulse to optical fibers 1, 2, 3 from ports 1, 2, 3, a rising edge is effective, 6.25 us later sending a pulse to optical fibers 4, 5, 6 from ports 4, 5, 6, the rising edge is effective, (12.5-6.25) us later sending a pulse to optical fibers 7, 8, 9 from ports 7, 8, 9, the rising edge is effective, (18.75-12.5) us later sending a pulse to optical fibers 10, 11 from ports 10, 11, and the rising edge is effective.

Inverters 1-11: immediately zero clearing triangular wave comparison counters in PWM modules after receiving the rising edges of the pulses.

Although the specific embodiments of the present invention have been described above in combination with the accompanying drawings, the protection scope of the present invention is not limited thereto. Those skilled in the art to which the present invention pertains should understand that various modifications or variations made by those skilled in the art based on the technical solutions of the present invention without any creative effort still fall into the protection scope of the present invention.

The invention claimed is:

1. A global synchronous pulse width modulation system for a distributed grid-connected inverter system, comprising a main control unit and a plurality of grid-connected inverters located at different geographical locations, wherein each grid-connected inverter is connected with a distributed power supply; each grid-connected inverter is connected with a grid through a point of common coupling; the main control unit communicates with all grid-connected inverters; the main control unit receives the information of the grid-connected inverters and respectively sends a global synchronous signal containing a global synchronous strategy to the grid-connected inverters after determining the global synchronous strategy; and the grid-connected inverters regulate the phases of their own pulse width modulation waves through the global synchronous signal to enable the pulse width modulation waves of the grid-connected inverters to satisfy a phase difference of harmonic counteraction, so as to counteract harmonic current injected by the grid-connected inverters into the grid.

2. A working method of the global synchronous pulse width modulation system for a distributed grid-connected inverter system that comprises a main control unit and a plurality of grid-connected inverters located at different geographical locations, wherein each grid-connected inverter is connected with a distributed power supply; each grid-connected inverter is connected with a grid through a point of common coupling; the main control unit communicates with all grid-connected inverters; the main control unit receives the information of the grid-connected inverters and respectively sends a global synchronous signal containing a global synchronous strategy to the grid-connected inverters after determining the global synchronous strategy; and the grid-connected inverters regulate the phases of their own pulse width modulation waves through the global synchronous signal to enable the pulse width modulation waves of the grid-connected inverters to satisfy a phase difference of harmonic counteraction, so as to counteract harmonic current injected by the grid-connected inverters into the grid, the method comprising the following steps:

step (1a): the main control unit receiving the information of the grid-connected inverters and determining the global synchronous strategy of the distributed grid-connected inverter systems; namely determining the time difference $\Delta t(m_a)$ between the pulse width modulation wave moments $t(m_a)'$ of the inverters $m_a$ in all of N inverters participating in global synchronous pulse width modulation and the pulse width modulation wave moment $t(1)'$ of an arbitrarily appointed reference inverter 1, where the value range of m is 2 to N, and a expresses that the inverters are not grouped; $\Delta t(m_a) = t(m_a)' - t(1)'$; wherein the inverter 1 is an arbitrarily appointed one, and since the pulse width modulation waves of the inverters are continuously repeated, the pulse width modulation wave of one inverter is appointed as reference;

step (2a): the main control unit determining the time interval of each synchronization according to the global synchronous strategy in the step (1a) and the clock accuracy of the grid-connected inverters, and judging whether a sending time is arrived at, if the sending time is arrived at, the main control unit sending the corresponding global synchronous signal to the grid-connected inverters to enter a step (3a); and if the sending time is not arrived at, returning to the step (1a);

step (3a):
after receiving the global synchronous signal of the main control unit, the grid-connected inverters only changing the output moments of their own pulse width modulation waves of the grid-connected inverters, with the pulse widths in the pulse width modulation waves unchanged, such that the pulse width modulation waves of the inverters and the pulse width modulation wave of the inverter 1 satisfy the time difference $\Delta t(m_a)$; and finally the phase difference between the pulse width modulation waves of the inverters satisfies the phase difference required by a synchronous unit to enable mutual counteraction of the harmonic current of the inverters between the inverters, so as to counteract the harmonic current injected by the grid-connected inverters into the grid.

3. A working method of the global synchronous pulse width modulation system for a distributed grid-connected inverter system that comprises a main control unit and a plurality of grid-connected inverters located at different geographical locations, wherein each grid-connected inverter is connected with a distributed power supply; each grid-connected inverter is connected with a grid through a point of common coupling; the main control unit communicates with all grid-connected inverters; the main control unit receives the information of the grid-connected inverters and respectively sends a global synchronous signal containing a global synchronous strategy to the grid-connected inverters after determining the global synchronous strategy; and the grid-connected inverters regulate the phases of their own pulse width modulation waves through the global synchronous signal to enable the pulse width modulation waves of the grid-connected inverters to satisfy a phase difference of harmonic counteraction, so as to counteract harmonic current injected by the grid-connected inverters into the grid, the method comprising the following steps:

step (1b): the main control unit receiving the information of the grid-connected inverters and determining the global synchronous strategy of the distributed grid-connected inverter systems; dividing all inverters participating in global pulse width modulation into N groups according to the principle that enables the harmonic current output by the inverters to be mutually counteracted between the inverters to the maximum, and determining the time difference $\Delta t(m_b)$ between the pulse width modulation wave moments $t(m_b)'$ of all inverters in the inverter groups $m_b$ and the pulse width modulation wave moment $t(1)'$ of an arbitrarily appointed reference inverter 1, where b expresses that the inverters are grouped; $\Delta t(m_b) = t(m_b)' - t(1)'$; the moment at the midpoint of the pulse is collectively set as the pulse width modulation wave moment; the inverter 1 is an arbitrarily appointed one, and since the pulse width modulation waves of the inverters are continuously repeated, the pulse width modulation wave of one inverter is appointed as reference; and since the pulse of the pulse width modulation wave has a certain width, the moment at the midpoint of the pulse is collectively set as the pulse width modulation wave moment;

step (2b): the main control unit determining the time interval of each synchronization according to the global synchronous strategy in the step (1b) and the clock accuracy of the grid-connected inverters, and judging whether a sending time is arrived at, if the sending time is arrived at, the main control unit sending the corresponding global synchronous signal to the grid-connected inverters to enter a step (3b); and if the sending time is not arrived at, returning to the step (1b);

step (3b):

after receiving the global synchronous signal of the main control unit, the grid-connected inverters only changing the output moments of their own pulse width modulation waves of the grid-connected inverters, with the pulse widths in the pulse width modulation waves unchanged, such that the pulse width modulation waves of the inverters and the pulse width modulation wave of the inverter 1 satisfy the time difference $\Delta t(m_b)$; and finally the phase difference between the pulse width modulation waves of the inverters satisfies the phase difference required by a synchronous unit to enable mutual counteraction of the harmonic current of the inverters between the inverters, so as to counteract the harmonic current injected by the grid-connected inverters into the grid.

4. The method of claim 2, wherein
the information of the grid-connected inverters in the step (1a) comprises parameters of the distributed grid-connected inverter system, parameters of the grid and requirements on the quality of the current injected by the point of common coupling into the grid.

5. The method of claim 2, wherein
the global synchronous control strategy in the step (1a) is as follows: the number of all inverters participating in the global pulse width modulation is N, and taking the pulse width modulation wave of one inverter as reference, the pulse width modulation waves of other inverters are lagged in sequence:

$$\Delta t(m_a)=(m_a-1)T_c/N;\ m=2,3\ldots N;$$

where $\Delta t(m_a)$ is the time difference between the pulse width modulation wave moment $t(m_a)'$ of the inverter $m_a$ and the pulse width modulation wave moment $t(1)'$ of the inverter 1;

$T_c$ is switching frequency; N is the number of the inverters participating in the global synchronous pulse width modulation; $m_a$ represents the $m_a$ th inverter; a expresses that the inverters are not grouped;

angle expression is as follows:

$$\Delta\varphi(m_a)=(m_a-1)\times 2\pi/N;\ m=2,3\ldots N;$$

where a expresses that the inverters are not grouped;
$\Delta\varphi(m_a)$ represents the degree of angle corresponding to $\Delta t(m_a)$ when a switching period is regarded as 360 degrees;
N is the number of the inverters participating in the global pulse width modulation.

6. The method of claim 3, wherein
the global synchronous control strategy in the step (1b) is as follows: all inverters participating in the global synchronous pulse width modulation are divided into N groups according to the principle that enables the harmonic current output by the inverters to be mutually counteracted between the inverters to the maximum, and taking the pulse width modulation wave of one inverter as reference, the pulse width modulation waves of other inverters are lagged in sequence:

$$\Delta t(m_b)=(m_b-1)T_c/N;\ m=2,3\ldots N;$$

where $\Delta t(m_b)$ is the time difference between the pulse width modulation wave moments $t(m_b)'$ of all inverters in the inverter group $m_b$ and the pulse width modulation wave moment $t(1)'$ of the inverter 1;

$T_c$ is switching frequency; N is the number of the inverter groups participating in the global synchronous pulse width modulation; $m_b$ represents the $m_b$th group of inverters; b expresses that the inverters are grouped;

angle expression is as follows:

$$\Delta\varphi(m_b)=(m_b-1)\times 2\pi/N;\ m=2,3\ldots N$$

where $\Delta\varphi(m_b)$ represents the degree of angle corresponding to $\Delta t(m_b)$ when a switching period is regarded as 360 degrees;
N is the number of the inverter groups participating in the global pulse width modulation.

7. The method of claim 2, wherein
in the step (3a), after the inverters receive the global synchronous signal, if the sending channel of the global synchronous signal is a fast communication channel, the signal transmission time is much shorter than the switching period of a switching element in the inverter, it is considered that the communication has no time delay in theoretical analysis, the synchronous unit determines the time intervals of the pulse width modulation waves of the inverters, after respectively arriving at the sending times determined in the step (2a), pulse signals are sent to N inverters by N ports through N fast communication channels, the time intervals of the N pulse signals represent the time intervals of the pulse width modulation waves of the inverters, after receiving the pulse signals, the inverters change the output moments of their own pulse width modulation waves of the grid-connected inverters, with the pulse widths in the pulse width modulation waves unchanged, such that the pulse width modulation waves of the inverters and the pulse width modulation wave of the inverter 1 satisfy the time difference $\Delta t(m_i)$, where i=a or b; a expresses that the inverters are not grouped; b expresses that the inverters are grouped.

8. The method of claim 2, wherein
in the step (3a), after the inverters receive the global synchronous signal, if the sending channel of the global synchronous signal is not a fast communication channel, the signal transmission time is not much shorter than the switching period of a switching element in the inverter, the signal transmission time is not negligible, and the phase of the synchronous signal is adjusted by an accurate GPS clock.

9. The method of claim 3, wherein
the information of the grid-connected inverters in the step 1(b) comprises parameters of the distributed grid-connected inverter system, parameters of the grid and requirements on the quality of the current injected by the point of common coupling into the grid.

10. The method of claim 3, wherein
in the step (3b), after the inverters receive the global synchronous signal, if the sending channel of the global synchronous signal is a fast communication channel, the signal transmission time is much shorter than the switching period of a switching element in the inverter, it is considered that the communication has no time delay in theoretical analysis, the synchronous unit determines the time intervals of the pulse width modulation waves of the inverters, after respectively arriving at the sending times determined in the step (2b), pulse signals are sent to N inverters by N ports through N fast communication channels, the time intervals of the N pulse signals represent the time intervals of the pulse width modulation waves of the inverters, after receiving the pulse signals, the inverters change the output moments of their own pulse width modulation waves of the grid-connected inverters, with the pulse widths in the pulse width modulation waves unchanged, such that the pulse width modulation waves of the inverters and the pulse width modulation wave of the inverter 1 satisfy the time difference $\Delta t(m_i)$, where i=a or b; a expresses that the inverters are not grouped; b expresses that the inverters are grouped.

11. The method of claim 3, wherein
in the step (3b), after the inverters receive the global synchronous signal, if the sending channel of the global synchronous signal is not a fast communication channel, the signal transmission time is not much shorter than the switching period of a switching element in the inverter, the signal transmission time is not negligible, and the phase of the synchronous signal is adjusted by an accurate GPS clock.

\* \* \* \* \*